(12) United States Patent
Baik et al.

(10) Patent No.: US 7,414,360 B2
(45) Date of Patent: Aug. 19, 2008

(54) ORGANIC ELECTROLUMINESCENT DEVICE COMPRISING A CONTACT PART ON A SCAN-CONNECTING ELECTRODE

(75) Inventors: Kwang-Heum Baik, Gumi (KR); Jung-Hwan Lee, Daegu (KR)

(73) Assignee: LG Electronics Inc., Seoul (KR)

( * ) Notice: Subject to any disclaimer, the term of this patent is extended or adjusted under 35 U.S.C. 154(b) by 266 days.

(21) Appl. No.: 10/932,009

(22) Filed: Sep. 2, 2004

(65) Prior Publication Data

US 2005/0046343 A1 Mar. 3, 2005

(30) Foreign Application Priority Data

Sep. 3, 2003 (KR) .................... 10-2003-0061354

(51) Int. Cl.
*H01J 1/62* (2006.01)
(52) U.S. Cl. .................. 313/504; 313/503; 313/506; 313/509
(58) Field of Classification Search .................. 313/500, 313/504–505
See application file for complete search history.

(56) References Cited

U.S. PATENT DOCUMENTS

| | | | | |
|---|---|---|---|---|
| 4,855,641 A | * | 8/1989 | Nakamura et al. | 313/505 |
| 5,936,344 A | * | 8/1999 | Nagayama | 313/505 |
| 5,952,037 A | * | 9/1999 | Nagayama et al. | 427/66 |
| 6,380,673 B1 | * | 4/2002 | Sekiya et al. | 313/504 |
| 6,611,095 B2 | * | 8/2003 | Kim | 313/505 |
| 2003/0076030 A1 | * | 4/2003 | Kim et al. | 313/491 |

* cited by examiner

*Primary Examiner*—Sikha Roy
*Assistant Examiner*—Natalie K Walford
(74) *Attorney, Agent, or Firm*—Birch, Stewart, Kolasch & Birch, LLP

(57) ABSTRACT

An organic electroluminescent device including a transparent substrate; transparent electrodes extended in one direction on the substrate; connecting electrodes for current supply formed in a crossing direction of the transparent electrodes, not to overlap the transparent electrodes, on one side of the substrate; scan-electrodes formed on the connecting electrodes; an insulation layer formed to cover a predetermined area of the substrate, the transparent electrodes, the connecting electrodes, and the scan-connecting electrodes except the emission parts of the transparent electrodes and the contact parts of the scan-connecting electrodes, wherein the area ($A_E$) of the emission part, the number (N) of the emission parts formed on a scan line, and the area ($A_C$) of the contact part are determined under the formula of $[(A_E \times N)/100 \leq A_C]$; an organic layer formed on the emission parts of the transparent electrodes; and a scan electrode layer.

10 Claims, 5 Drawing Sheets

ORGANIC ELECTROLUMINESCENT DEVICE COMPRISING A CONTACT PART ON A SCAN-CONNECTING ELECTRODE

CROSS-REFERENCE TO RELATED APPLICATION

This application claims priority from Korean Patent Application No. 2003-61354, filed on Sep. 3, 2003, the contents of which are incorporated herein for reference in their entirety.

BACKGROUND OF THE INVENTION

1. Field of the Invention

The present invention relates to an organic electroluminescent device. In particular, the present invention relates to the organic electroluminescent device forming a contact part contacting with a scan electrode layer on a scan-connecting electrode, and supplying electric current to an emission part through the contact part.

2. Description of the Related Art

Organic electroluminescence is a phenomenon forming an exciton by combining an electron and a hole supplied through the cathode and the anode, respectively, in an organic layer, and emitting light with specific wavelength by energy of the exciton.

FIG. 1 is a top view showing the organic electroluminescent device using the organic electroluminescence. FIG. 2 is a sectional view taken along the line of II-II of FIG. 1.

The organic electroluminescent device has a general structure as shown in FIG. 2. The organic electroluminescent device comprises a transparent substrate 1, an ITO transparent electrode 2 for the anode, patterned in one direction on the transparent substrate 1, an insulation layer 3 deposited on the remaining area except an emission part 20 of the organic electroluminescent device, a wall 4 formed in the crossing direction to the extended direction of the transparent electrode 2 on the insulation layer 3, an organic layer 5, and a metal scan electrode layer 6 for the cathode.

FIG. 3 is a sectional view taken along the line of III-III of FIG. 1. The scan electrode layer 6 placed between the walls 4 along the line of III-III of FIG. 1 is defined as a scan line.

An ITO connecting electrode 10 is provided to supply the current to the scan electrode layer 6 of the organic electroluminescent device as shown in FIG. 3. ITO is a metal made by doping tin oxide ($SnO_2$) to indium oxide ($In_2S_3$), and so has satisfactory transparent property, but has a problem of high electric resistance.

Therefore, a method to supply the current to the scan electrode layer 6 fluently, as shown in FIG. 3, is one to form a scan-connecting electrode 11 made of a lower electric resistance material than ITO on the connecting electrode 10.

The organic electroluminescent device gradually requires supply of increased current in order to increase the emission area and to achieve the display with high brightness. However, the contact resistance by contact of the different kinds of materials is generated between the scan-connecting electrode 11 and the scan electrode layer 6. Thus, if the contacting area is not more than a certain size, that is, unless the contact resistance is less than a certain value, the brightness is decreased because the current cannot be sufficiently supplied into the organic electroluminescent device.

In this case, desired brightness cannot be obtained even though the applied voltage is sufficiently increased. Another problem therein is that the organic electroluminescent device is deteriorated by heat generated from the contact resistance by the increased amount of current.

This can be explained by Ohm's law ($I=V/R$), wherein V means voltage, I means current, and R means resistance. Here, the voltage (V) should be increased in order to increase the current (I) for high brightness. However, if the contact resistance (R) generated between the scan-connecting electrode 11 and the scan electrode layer 6 is increased, the effect of the increased voltage (V) is offset.

Also, the increase of resistance (R) causes a problem to increase heat (Q) generated therefrom because the heat (Q) per hour generated by resistance (R) is defined as $Q=I^2 \times R$.

SUMMARY OF THE INVENTION

The object of the present invention is to provide an organic electroluminescent device forming a contact part with a predetermined size between a scan-connecting electrode and a scan electrode layer, thereby decreasing contact resistance, to decrease heat resulted from supply of increased current and to obtain desired brightness.

The organic electroluminescent device according to one embodiment of the present invention comprises a transparent substrate; a plurality of transparent electrodes for the anode, extended in one direction on the substrate; a plurality of connecting electrodes for current supply formed in the crossing direction to the extended direction of the transparent electrodes, not to overlap the transparent electrodes, on one side of the substrate; a plurality of scan-connecting electrodes formed on the connecting electrodes; an insulation layer formed to cover a predetermined area of the substrate, the transparent electrodes, the connecting electrodes, and the scan-connecting electrodes except the emission parts of the transparent electrodes and the contact parts of the scan-connecting electrodes, wherein the area ($A_E$) of the emission part, the number (N) of the emission parts formed on a scan line, and the area ($A_C$) of the contact part are determined under the formula of $[(A_E \times N)/100 \leq A_C]$; an organic layer formed on the emission parts of the transparent electrodes; and a scan electrode layer formed to cover the contact parts, the emission parts, and the insulation layer.

Therefore, the organic electroluminescent device according to the present invention can obtain desired brightness in the emission part without heat generation of the contact part by forming the contact part with a certain size on the scan-connecting electrode, and supplying the current to the scan electrode layer through the contact part.

BRIEF DESCRIPTION OF THE DRAWINGS

The above and other features and advantages of the present invention will be more clearly understood from the following detailed description taken in conjunction with the accompanying drawings.

DESCRIPTION OF EMBODIMENTS

Hereinafter, preferred embodiment of the present invention will be explained in more detail with reference to the accompanying drawings.

FIGS. 4a to 4f are top views showing steps for making the organic electroluminescent device according to one embodiment of the present invention.

Figure 1:
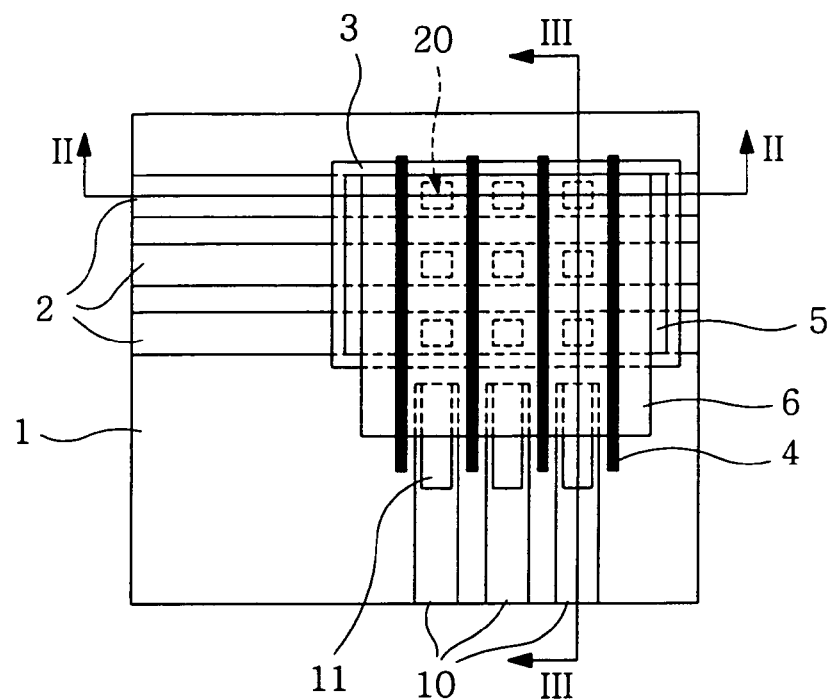
FIG. 1 is a top view showing the organic electroluminescent device using the organic electroluminescence.
Figure 2:
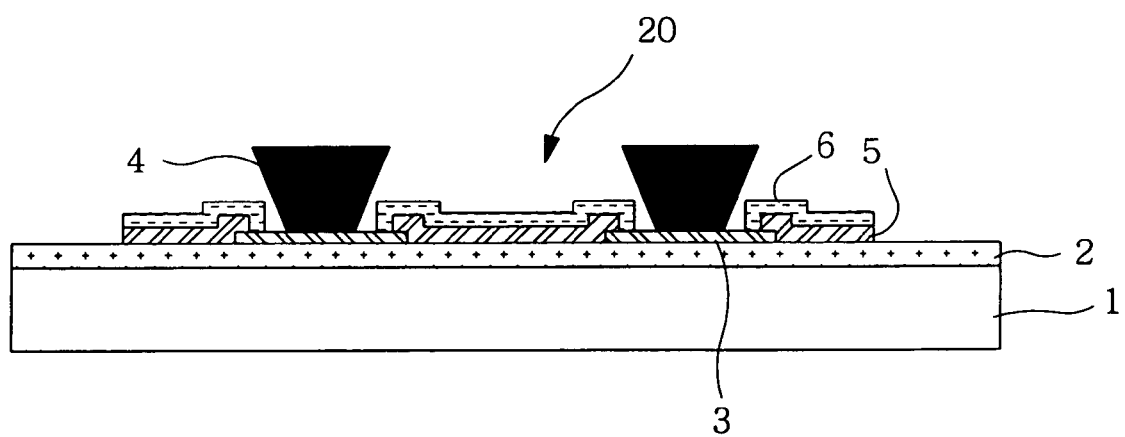
FIG. 2 is a sectional view taken along the line of II-II of FIG. 1.
Figure 3:
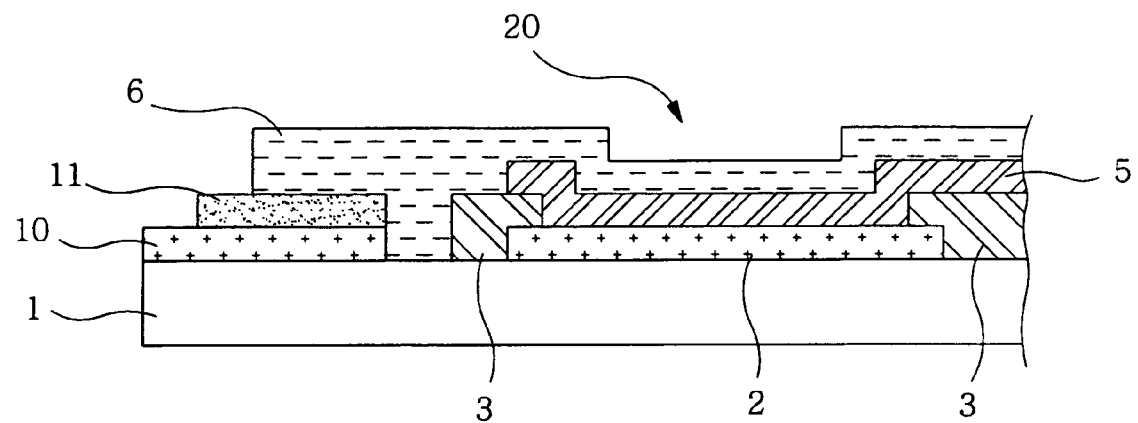
FIG. 3 is a sectional view taken along the line of III-III of FIG. 1.
Figure 4A:
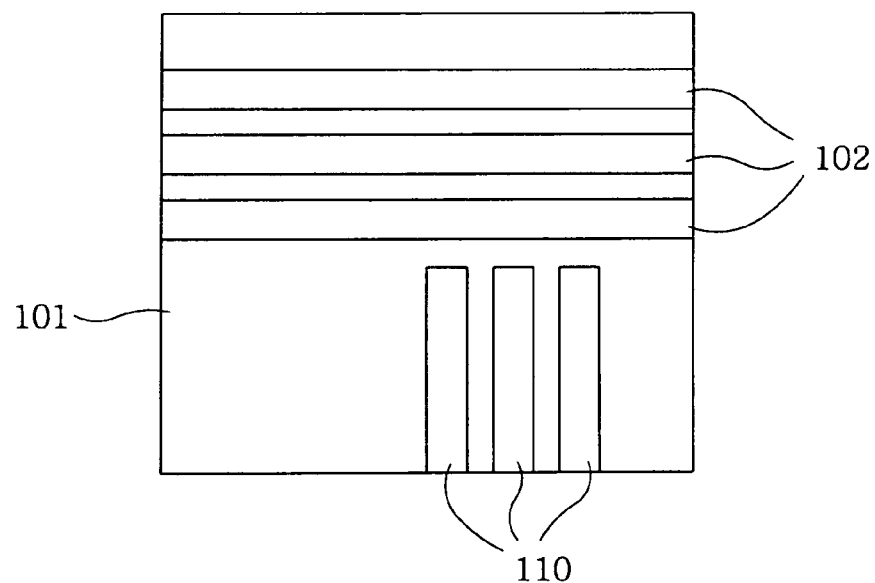
FIGS. 4a to 4f are top views showing steps for making the organic electroluminescent device according to one embodiment of the present invention.

An ITO layer is deposited on a transparent substrate 101 by using the vacuum evaporating method, and then patterned to a plurality of transparent electrodes 102 in one direction by the photolithographic method. Also, in the patterning process by the photolithographic method, a plurality of connecting electrodes 110 are formed in the crossing direction to the extended direction of the transparent electrodes 102, not to overlap the transparent electrodes 102, on one side of the transparent substrate 101 (FIG. 4a).

Figure 4B:
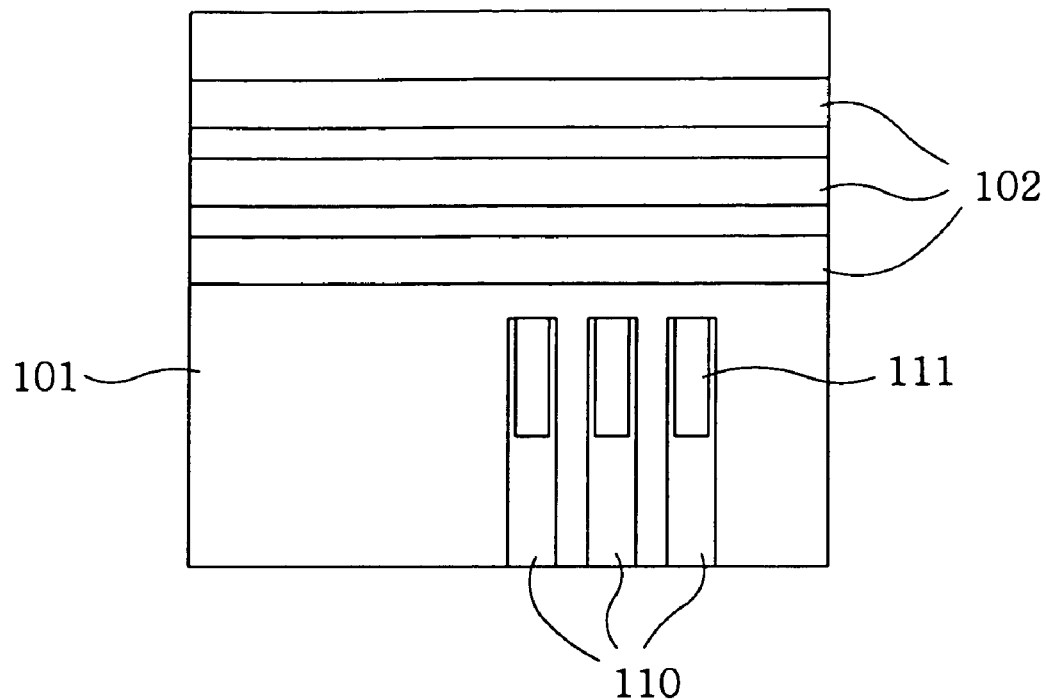

The connecting electrode 110 has high electric resistance. Therefore, a material with lower electric resistance than the connecting electrode 110 is evaporated and deposited on the whole area of the transparent substrate 101 on which has the connecting electrodes 110, and patterned by the photolithographic method, to form a plurality of scan-connecting electrodes 111 on the connecting electrodes 110 (FIG. 4b).

Figure 4C:
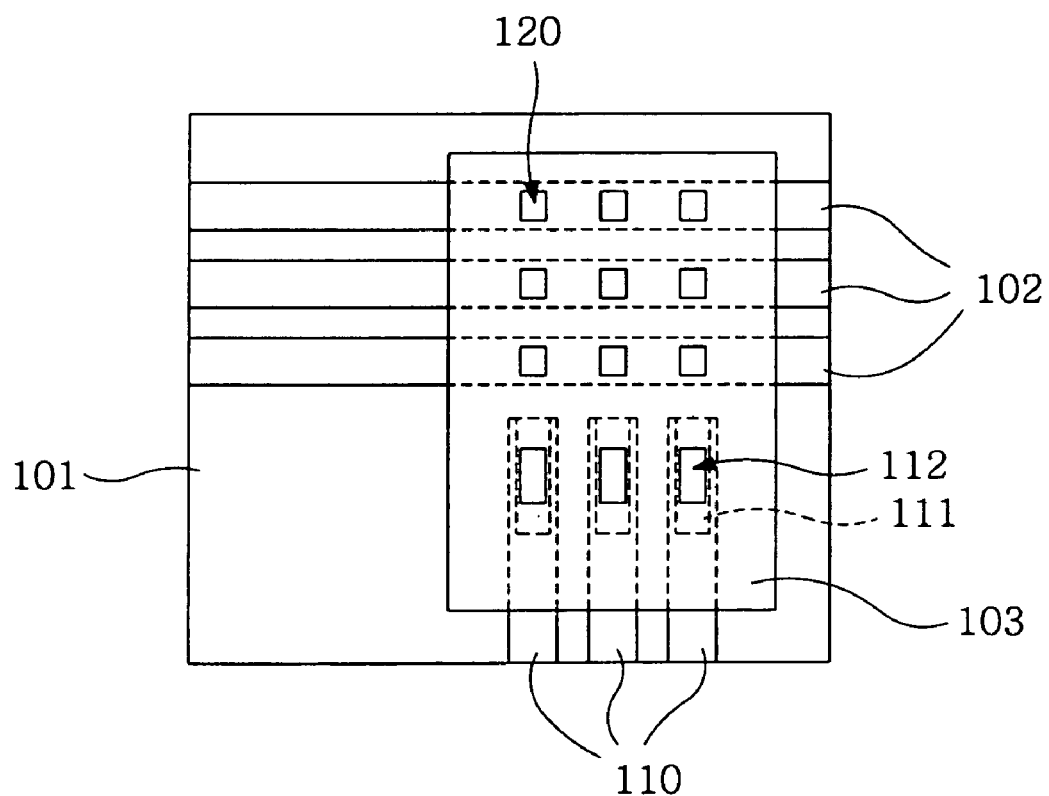

Then, an insulation layer 103 is formed by depositing and patterning an insulation layer material on the transparent substrate 101, as shown in FIG. 4c. This process is a step to remove the insulation layer material by the photolithographic method in order to form the respective areas corresponding to the emission parts 120 and the contact parts 112.

The area ($A_C$) of the contact part 112 is determined under the formula of $[(A_E \times N)/100 \leq A_C]$, wherein the area of the emission part 120 is $A_E$, the number of the emission parts 120 formed on one scan line is N, and the area of the contact part 112 is $A_C$.

The minimum value of the area of the contact part 112 is the total area of the emission parts 120 formed on one scan line multiplied by 1/100. If the minimum area of the contact part 112 satisfying the above formula is determined, the maximum contact resistance value is determined thereby.

That is, when the area ($A_C$) of the contact part 112 is larger than the minimum area of the contact part 112 determined from the above formula (that is, the contact resistance value is less than the maximum contact resistance value determined from the above formula), desired brightness is obtained by reducing heat resulted from applied current.

Figure 4D:
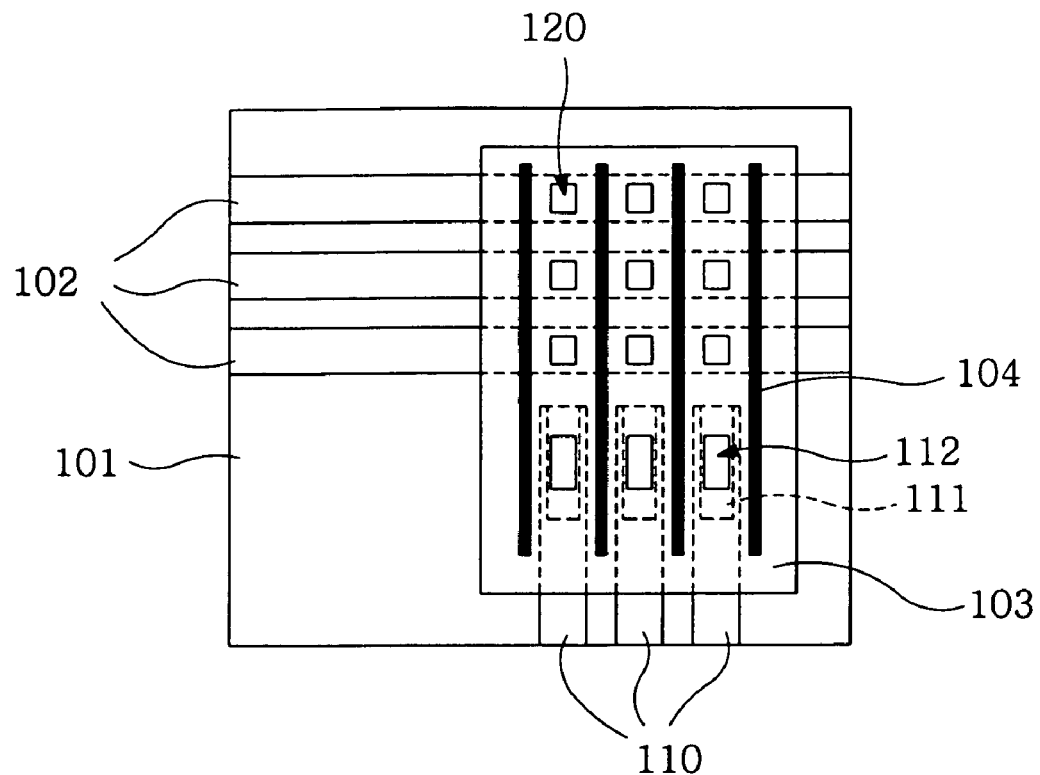

Then, as shown in FIG. 4d, the walls 104 are formed in the crossing direction to the extended direction of the transparent electrodes 102, on the insulation layer 103 by the photolithographic method. The wall 104 has an overhang structure that the upper part of the wall has wider width than the lower part of the wall 104, to separate an organic layer 105 and a scan electrode layer 106 evaporated after this step into a plurality of areas.

Figure 4E:
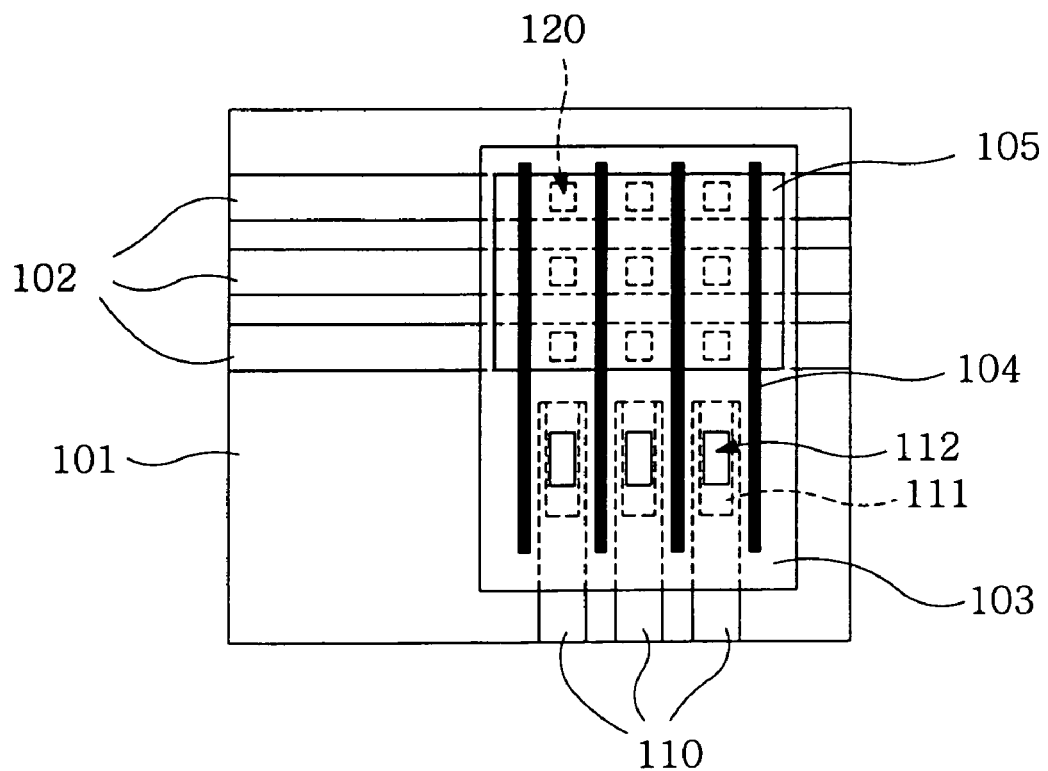

And, as shown in FIG. 4e, the organic layer 105 is evaporated and deposited on the insulation layer 103 and the transparent electrodes 102, and such organic layer 105 is formed in the same direction as the walls 104 in the space formed between the walls 104.

Figure 4F:
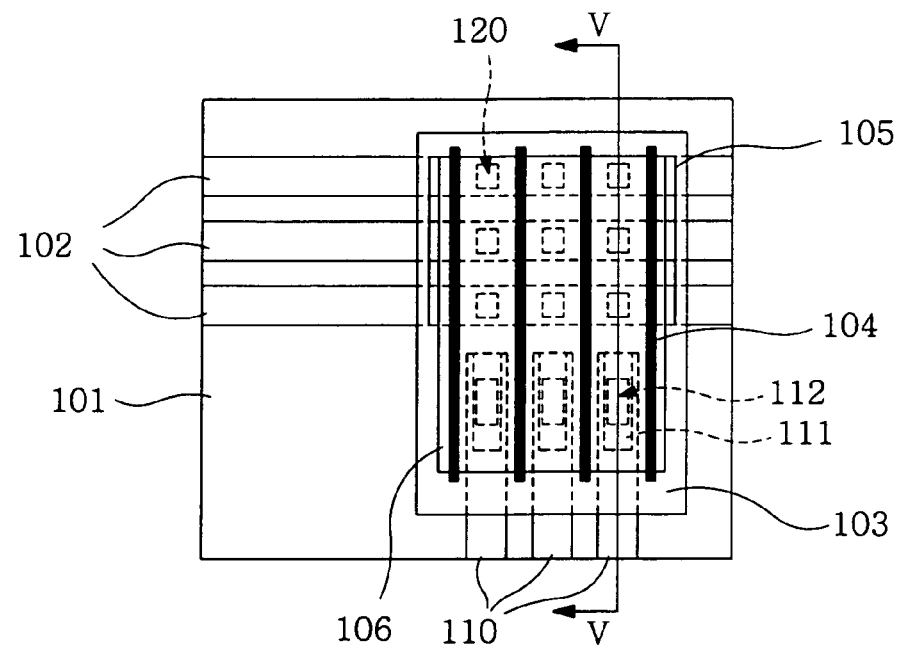

Then, as shown in FIG. 4f, the scan electrode layer 106 is evaporated and deposited to contact at the contact parts 112 of the scan-connecting electrodes 111 formed on the connecting electrodes 110.

Figure 5:
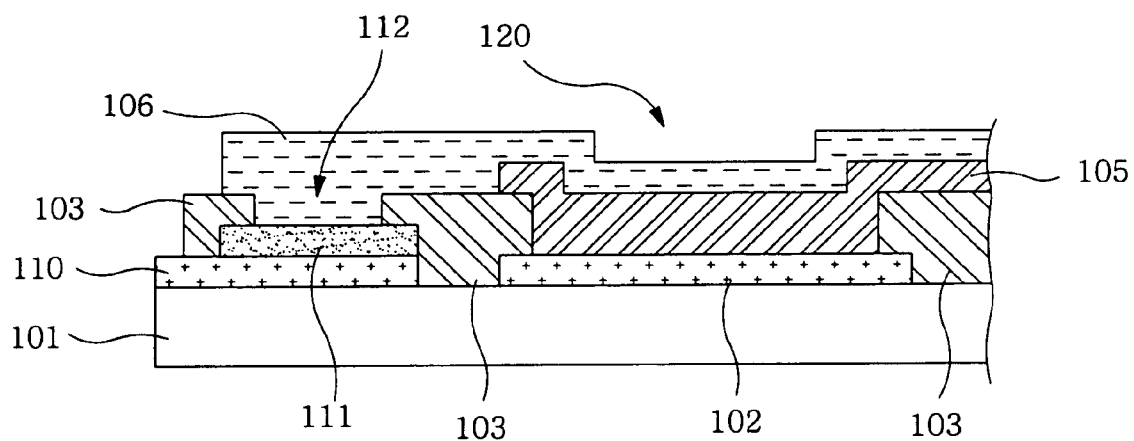
FIG. 5 is a sectional view showing the organic electroluminescent device according to one embodiment of the present invention taken along the line of V-V of FIG. 4f.

FIG. 5 is a sectional view showing the organic electroluminescent device according to one embodiment of the present invention taken along the line of V-V of FIG. 4f.

As shown in FIG. 5, the insulation layer 103 forms the contact part 112 having the area ($A_C$) determined by the above formula on the scan-connecting electrodes 111, through which the current needed in each emission part 120 can be transferred without any heat generation at the contact part 112

As described above, the organic electroluminescent device according to the present invention can obtain desired brightness in the emission part without any heat generation at the contact part by forming the contact part with a certain area on the scan-connecting electrode, and supplying the current to the scan electrode layer through the contact part.

What is claimed is:

1. An organic electroluminescent devices, comprising:
   a transparent substrate;
   a plurality of transparent electrodes on the transparent substrate and arranged to extend on the transparent substrate in a first direction along the transparent substrate;
   a plurality of connecting electrodes
      on the transparent substrate,
      arranged to extend on the transparent substrate in a direction orthogonal to the first direction of the plurality of transparent electrodes, and
      arranged to avoid contact with the plurality of transparent electrodes;
   a plurality of scan-connecting electrodes formed on the plurality of connecting electrodes;
   an insulation layer on a predetermined area of the transparent substrate, an edge portion of the plurality of transparent electrodes, a portion of the plurality of connecting electrodes, and an edge portion of the plurality of scan-connecting electrodes, the insulation layer formed not to be in contact or cover emission parts of the plurality of transparent electrodes and contact parts of the plurality of scan-connecting electrodes, wherein an area ($A_E$) of one of the emission parts of the plurality of transparent electrodes, number (N) of the emission parts of the plurality of transparent electrodes formed on a scan line, and an area ($A_C$) of one of the contact parts of the plurality of scan-connecting electrodes are determined under the formula of $[(A_E \times N)/100 \leq A_C]$;
   an organic layer formed on the emission parts of the plurality of transparent electrodes; and
   a scan electrode layer formed on the contact parts of the plurality of scan-connecting electrodes and arranged to cover emission parts of the plurality of transparent electrodes, and at least a portion of the insulation layer.

2. An organic electroluminescent device, comprising:
   a transparent substrate;
   a plurality of transparent electrodes on the transparent substrate and arranged to extend in one direction on the transparent substrate;
   a plurality of connecting electrodes on the transparent substrate arranged to extend in a direction orthogonal to the one direction of the plurality of transparent electrodes;
   a plurality of scan-connecting electrodes formed on portions of the plurality of connecting electrodes; and
   an insulation layer formed over the transparent substrate, wherein an area ($A_E$) of one of the emission parts of the plurality of transparent electrodes, a number (N) of the emission parts of the plurality of transparent electrodes formed on a scan line, and an area ($A_C$) of one of the contact parts of the plurality of scan-connecting electrodes are determined according to a formula of $[(A_E \times N)/100 \leq A_C]$.

3. The device of claim 1, wherein a thickness of the scan electrode layer disposed in the contact parts of the plurality of scan-connecting electrodes is greater than a thickness of the scan electrode layer disposed in the emission parts of the plurality of transparent electrodes.

4. The device of claim 1, wherein the insulation layer is disposed on the plurality of connecting electrodes and the plurality of scan-connecting electrodes.

5. The device of claim 4, wherein a thickness of the insulation layer contacting with the plurality of scan-connecting electrodes is different from a thickness of the insulation layer contacting with the plurality of transparent electrodes.

6. The device of claim 1, wherein a material of the scan electrode layer disposed on the emission parts of the plurality of transparent electrodes is equal to a material of the scan electrode layer disposed on the contact parts of the plurality of scan-connecting electrodes.

7. The device of claim 1, wherein the plurality of scan-connecting electrodes comprise a first material and the plurality of transparent electrodes comprise a second material, an electric resistance of the first material being smaller than an electric resistance of the second material.

8. The device of claim 2, wherein a thickness of the scan electrode layer disposed in the contact parts of the plurality of scan-connecting electrodes is thicker than a thickness of the scan electrode layer disposed in the emission parts of the plurality of transparent electrodes.

9. The device of claim 2, wherein the insulation layer covers edges of the plurality of connecting electrodes and the plurality of scan-connecting electrodes.

10. The device of claim 2, wherein the plurality of scan-connecting electrodes comprise a first material and the plurality of transparent electrodes comprise a second material, an electric resistance of the first material being smaller than an electric resistance of the second material.

* * * * *